United States Patent [19]

Paoli et al.

[11] Patent Number: 5,764,676
[45] Date of Patent: Jun. 9, 1998

[54] TRANSVERSELY INJECTED MULTIPLE WAVELENGTH DIODE LASER ARRAY FORMED BY LAYER DISORDERING

[75] Inventors: Thomas L. Paoli, Los Altos, Calif.; Kevin J. Beernink, Urbana, Ill.

[73] Assignee: Xerox Corporation, Stamford, Conn.

[21] Appl. No.: 721,063

[22] Filed: Sep. 26, 1996

[51] Int. Cl.$^6$ .................................................. H01S 3/19
[52] U.S. Cl. ............................ 372/50; 372/45; 372/46
[58] Field of Search ........................ 372/23, 27, 43–46, 372/50

[56] References Cited

U.S. PATENT DOCUMENTS

| | | | |
|---|---|---|---|
| 4,987,468 | 1/1991 | Thornton | 357/34 |
| 5,048,040 | 9/1991 | Paoli | 372/23 |
| 5,115,285 | 5/1992 | Menigaux et al. | 372/50 |
| 5,124,279 | 6/1992 | Goto | 372/45 |
| 5,157,680 | 10/1992 | Goto | 372/50 |
| 5,272,715 | 12/1993 | Guerin | 372/23 |
| 5,319,655 | 6/1994 | Thornton | 372/23 |
| 5,323,026 | 6/1994 | Paoli | 372/50 |
| 5,386,428 | 1/1995 | Thornton et al. | 372/50 |
| 5,412,678 | 5/1995 | Treat et al. | 372/45 |
| 5,436,193 | 7/1995 | Beernink et al. | 437/129 |
| 5,438,584 | 8/1995 | Paoli et al. | 372/45 |
| 5,465,263 | 11/1995 | Bour et al. | 372/23 |

OTHER PUBLICATIONS

Appl. Physics Letters, vol., 65, No. 21 pp. 2696–2698 by Thornton Nov. 1994.

"Defect Generation and Suppression During the Impurity–Induced Layer Disordering of Quantum–Sized GaAs/GaInP Layers".

*Primary Examiner*—Rodney B. Bovernick
*Assistant Examiner*—Luong-Quyen T. Phan

[57] ABSTRACT

This invention relates to a laser array which can produce at least two independently addressable laser beams, each of which has fully index-guided buried optical waveguides. Specifically, the array is formed by a two-step impurity disordering process, which simplifies the fabrication of laser arrays and optoelectronic integrated circuits.

11 Claims, 4 Drawing Sheets

TRANSVERSELY INJECTED MULTIPLE WAVELENGTH DIODE LASER ARRAY FORMED BY LAYER DISORDERING

This invention is made with U.S. Government support under Grant No.70NANB2H1241 awarded by the Department of Commerce. The U.S. Government has certain rights in the invention.

CROSS REFERENCE TO RELATED APPLICATIONS

The present invention is related to commonly assigned and co-pending U.S. application entitled "Independently-Addressable Monolithic Laser Arrays," U.S. Ser. No. 08/688,179, filed on Jul. 26, 1996, invented by T. Paoli.

FIELD OF INVENTION

The present invention relates generally to solid state lasers. More specifically, the invention relates to laser arrays which are fabricated from a two-step layer disordering process.

BACKGROUND OF INVENTION

Solid state semiconductor laser arrays have significant applications in optoelectronic integrated circuits and high-speed xerographic printing. An optoelectronic integrated circuit often requires the integration of laser devices with their drive circuits on a single substrate. However, typical laser devices are often fabricated on p-type or n-type substrates while electronic devices such as field effect transistors (FET'S) or bipolar transistors, are often fabricated on semi-insulating substrates. This difference complicates the fabrication of embedded circuits along with laser devices. Accordingly, there is a need for a laser device structure which can be fabricated on p-type, n-type, or semi-insulating substrate so that its integration with other electronic devices can be easily achieved.

In high-speed xerographic printing, there is also a need for simplifying the fabrication process of an independently addressable laser array emitting multiple wavelengths. In order to achieve high-speed single-pass color printing, four laser beams are used, one for each primary color (cyan, magenta, and yellow) and black. The laser beams simultaneously strike a single raster output polygon mirror and a single set of scan optics. The beams are then separated by optical filters, and each beam is directed to a photoreceptor for printing a different color. A full-color print is formed by superimposing an electrostatic image in black with an electrostatic image in each of the three primary colors.

For overlapping beams of different wavelengths to be separable, the difference in wavelength between any two lasers generally has to be at least 50 nanometers (nm) to enable low-cost optics to separate the beams. A common approach to forming a laser array emitting at least two distinct wavelengths utilizes a so-called "stacked active regions" approach to fabricate closely-spaced, independently-addressable, monolithic laser arrays, which output multiple wavelengths or orthogonally polarized beams. Several stacked active region structures are described in U.S. Pat. No. 5,157,680, entitled "Integrated Semiconductor Laser," by Goto and U.S. Pat. No. 5,386,428, entitled "Stacked Active Region Laser Array For Multicolor Emissions," by Thornton et al.

Generally, a stacked active region monolithic array includes multiple active layers, which are located in a common waveguide. For instance, a dual-wavelength array is typically formed by first depositing a lower cladding layer on a semiconductor substrate, after which two active layers are sequentially deposited on the cladding layer. Each active layer is optimized to output a laser beam of a different wavelength. Under this stacked growth approach, the second active layer is grown above the first active layer during the same epitaxial process. No removal of any part of the first active layer is required, and hence no vertical interface between the two active layers exists. This allows two laser beams to be formed in close proximity to each other in the vertical direction so that there is no tangential offset in scanning. After both active layers have been formed, the active region closest to the surface will be removed by an etching process, allowing the lower active region to lase at a particular wavelength. To accomplish the removal of the top active layer, an etch stop layer is generally inserted between the two active layers to minimize unintentional removal of any portion of the lower active layer. After the etching process is completed, a final cladding layer and capping layer are grown over the entire sample.

Although such a stacked growth approach provides closely-spaced laser beams in the vertical direction, it continues to suffer a key disadvantage. The top active layer needs to be removed in order to access the lower active layer and to use a single cladding layer for forming the top waveguiding layer for both laser structures. However, the removal of the top active layer depends upon a well-controlled etching step. Since the active layer is only 10 to 20 nm in thickness, any over-etching may remove all or part of the lower active layer. After the etching has been performed, layers immediately above the lower active layer are exposed. The exposed area is susceptible to undesirable contamination or oxide formation, which is a particularly serious problem in the more reactive $Al_xGa_{1-x}As$ material system.

BRIEF SUMMARY OF INVENTION

The present invention provides an array of lasers, each of which has a fully index-guided buried optical waveguide. The present invention utilizes a two-step impurity induced layer disordering ("IILD") process in which a deep impurity diffusion creates the optical waveguides and a shallow impurity diffusion selectively eliminates one active layer to produce the laser with a shorter wavelength. Both layer disordering processes are initiated only from impurities deposited and patterned on the surface of the epitaxial layers. Since the disordering atoms are introduced from the surface, there is no need to incorporate a buried disordering source during epitaxial deposition. In addition, the second impurity disordering process does not require an accurate mask alignment. Thus, the present invention therefore provides more flexibility and reproducibility in the fabrication process.

Another advantage of this invention is that it maintains the key advantages of a stacked-growth technique, but at the same time eliminates the need for removing either the top or bottom active layer by etching. In other words, this invention does not depend upon an etching process to remove layers as thin as 10 to 20 nm. Consequently, the vertical separations between lasers can be accurately and reproducibly controlled by epitaxial growths. At the same time, since no etching of the active region is involved, the chances of contamination or oxidation of the sample are minimal.

Yet another advantage is that this invention is independent of the doping of the substrate material. The transversely injected laser arrays can be formed on semi-insulating, p-type, or n-type substrates, simplifying the formation of embedded circuitry with laser devices.

A further advantage of the present invention is that the top surface of the monolithic chip remains substantially planar. The present invention requires no regrowth to form the lateral waveguides.

The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
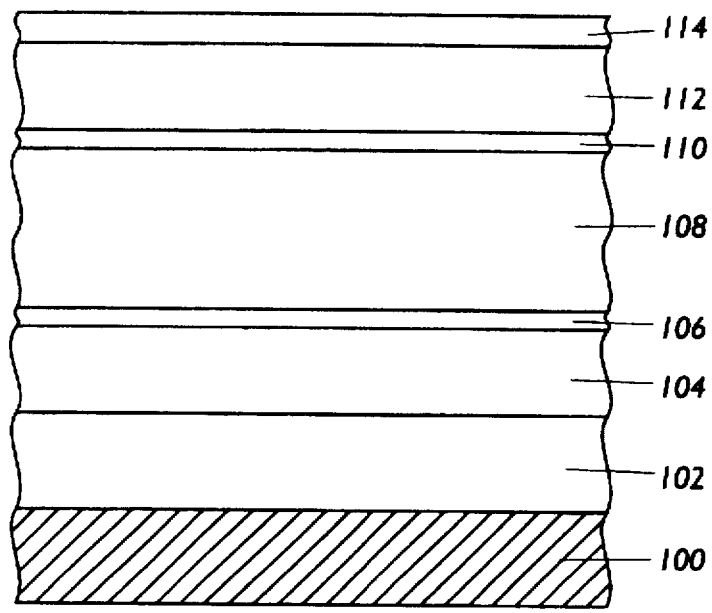
FIG. 1 illustrates the layers formed on a semi-insulating GaAs substrate for use in the fabrication of the preferred embodiment of the present invention.

FIG. 1 illustrates a semiconductor structure which is used to form the preferred embodiment of the present invention. The structure illustrated includes a number of semiconductor layers, which form a dual-wavelength or a dual-polarization laser array with an upper and a lower lasing element. This preferred embodiment of the present invention can easily be extended to form a four-laser array. For a dual-wavelength embodiment, each active layer is constructed to emit light with a different wavelength. For a dual-polarization embodiment, each active layer is constructed to emit light with a different polarization. It is well-known that a tensile strain can be created in the active layer of a lasing element so that the laser will be switchable between its transverse electric (TE) and transverse magnetic (TM) mode of operation. Thus, another embodiment of the present invention contains lasing elements, each of which emits light at a different wavelength whose polarization can be switched between TE and TM modes. A solid state laser which is switchable between TE and TM polarization modes of operation is described in U.S. Pat. No. 5,438,584 entitled "Dual Polarization Laser Diode With Quarternary Material System" by Paoli et al.

As shown in FIG. 1, a p-type GaAs buffer layer 102 of approximately 1 μm is grown on a semi-insulating GaAs substrate 100 using an epitaxial deposition process known as metal-organic chemical vapor deposition (MOCVD). Other deposition processes such as liquid phase epitaxy (LPE), molecular beam epitaxy (MBE), or other known crystal growth processes can also be used.

After the buffer layer 102 has been deposited, a p-type AlGaAs layer 104 forms the lower cladding layer of a lower lasing element. The aluminum mole fraction of the cladding layer 104 typically ranges from 0.6 to 0.8. Above the p-type AlGaAs cladding layer 104 is a lightly p-doped AlGaAs active layer 106. The active layer 106 may be a single quantum well, a multiple quantum well, or a layer with thickness greater than that of a quantum well. The thickness of a quantum well is typically 5 to 20 nm. With respect to the aluminum mole fraction of the active layer, a typical value of around 0.14 is required to produce a lasing element at approximately 780 nm. Generally, the aluminum mole fraction of the AlGaAs active layer 106 should be lower than that of the cladding layers 104 and 108.

The active layer 106 of the lower laser structure can also be made of InGaP. In this case, the thickness of the InGaP layer should be sufficiently thin so that relatively minimal or zero defects will be introduced by an impurity induced layer disordering process. As discussed in "Defect Generation and Suppression During the Impurity Induced Layer Disordering of Quantum-Sized GaAs-GaInP Layers" by Thornton et al., Appl. Phys. Letters, vol. 65, p. 2696 (1994), it is generally expected that the GaInP layer must be thinner than about 20 nm. Thus, a laser emitting at approximately 675 nm can be obtained with an active layer composed of $In_{0.6}Ga_{0.4}P$ of approximately 8 nm thick. Alternatively, the active layer 106 of the lower laser structure can be made of $Al_xGa_{1-x}As_yP_{1-y}$. To produce a laser structure emitting at approximately 700 nm, x is approximately 0.35 and y is approximately 0.97. The thickness of this layer is typically 8 to 12 nm.

After the active layer 106 of the lower lasing element has been formed, typically 0.8 to 1.0 μm of p-type AlGaAs layer 108 is deposited, upon which a lightly p-doped GaAs active layer 110 is deposited to produce a laser element emitting light with a wavelength of approximately 830 to 840 nm. The AlGaAs layer 108 acts as the upper cladding layer of the lower lasing element as well as the lower cladding layer of the upper lasing element. Then, approximately 1.0 μm of p-type AlGaAs layer 112 and 100 nm of a p-type GaAs cap layer 114 are grown. The p-type AlGaAs layer 112 forms the upper cladding layer of an upper lasing element. Its aluminum mole fraction typically ranges from 0.6 to 0.8. The p-type GaAs layer 114 facilitates the formation of p-type ohmic contacts to the laser structures. Generally, the active layer closest to the surface has a lower bandgap, and the bandgap increases for each active layer that is further away from the surface. In other words, the lower lasing element generally produces an emission with a shorter wavelength (λ) than that of the upper lasing element. This sequence of active regions is generally preferred because elimination of the low-bandgap layer is required in order to provide injection to only high-bandgap layer.

Figure 2:
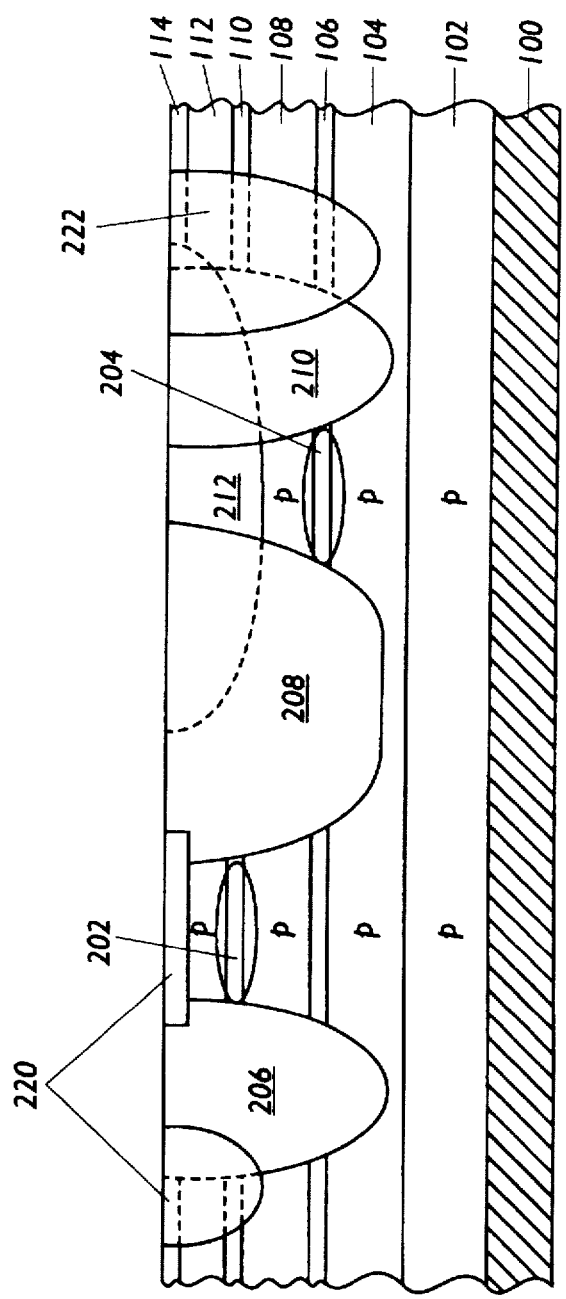
FIG. 2 illustrates an intermediate structure, which occurs prior to the isolation process, in the fabrication of the preferred embodiment in accordance with the present invention.

After all the semiconductor layers shown in FIG. 1 have been formed, a two-step impurity induced layer disordering ("IILD") process is used to form the waveguides of the upper lasing element 202 and the lower lasing element 204 shown in FIG. 2. Lateral waveguiding is achieved by intermixing the semiconductor layers. The lateral bandgap changes provide lateral carrier confinement and index waveguiding for each lasing element, 202 or 204. Both steps in this IILD process are initiated from the surface of the semiconductor sample, requiring no impurity atoms to be deposited during the epitaxial growth process. First, n-type disordering atoms such as silicon are diffused into the regions 206, 208, and 210, forming the lateral waveguides for the lasing elements 202 and 204. A typical silicon concentration used in such a process is around $3 \times 10^{18}$ cm$^{-3}$. It is well-known that IILD can be used to form lateral waveguides in GaAs/$Al_xGa_{1-x}As$ materials as shown in U.S. Pat. No. 5,386,428, entitled "Stacked Active Region Laser Array For Multicolor Emission," by Thornton et al.

After the lateral waveguides have been formed, there is no need to remove the active layer 106 of the lower laser element 204 in order to form the upper lasing element 202 which has a lower bandgap. Carriers naturally populate the lowest energy states in the lowest bandgap material before higher energy states in higher bandgap material. Consequently simultaneously injecting carriers into multiple layer structures containing active layers with different bandgaps does not significantly populate the high bandgap layers. Carriers can be injected into the high bandgap layers such as the AlGaAs active layer 106 only if injection into the low bandgap layers such as the GaAs active layer 110 is prevented.

However, to form the lower lasing element 204, since the active layer 110 of the upper lasing element 202 is not removed under the present invention, the layers constituting the upper lasing element need to be short-circuited so that current will only travel through the lower lasing element 204. Therefore, silicon is diffused into the region 212 above the lower lasing element 204 using a shallow IILD process. This IILD process produces disordering atoms which penetrate through the top GaAs layer 114, the top AlGaAs cladding layer 112, and the active GaAs layer 110 of the upper lasing element 202. A typical doping level for such a process is around $3 \times 10^{18}$ cm$^{-3}$. A typical temperature at which the disordering process is carried out is 800° to 900° C. Since the region 212 formed by this second IILD process occupies a relatively large area and overlaps with the regions 208 and 210, this second IILD process requires only normal accuracy in the photolithography and masking process. After the 2-step IILD process has been completed, lateral p-n junctions formed by the first diffusion are used to inject carriers into the available active layer with the lowest bandgap.

The semiconductor sample is then masked off for proton implantation, which isolates the contacts of lasing elements 202, 204. After the semiconductor sample has been properly masked, protons are implanted into the cross-hatched regions 220 and 222 as shown in FIG. 2. Other isolation techniques known to those of ordinary skill in the art may also be used. Under this approach, since the lateral waveguides and isolations for contacts are formed by impurity disordering or implantation, the topology of both lasing elements 202 and 204 remains relatively planar.

Figure 3:
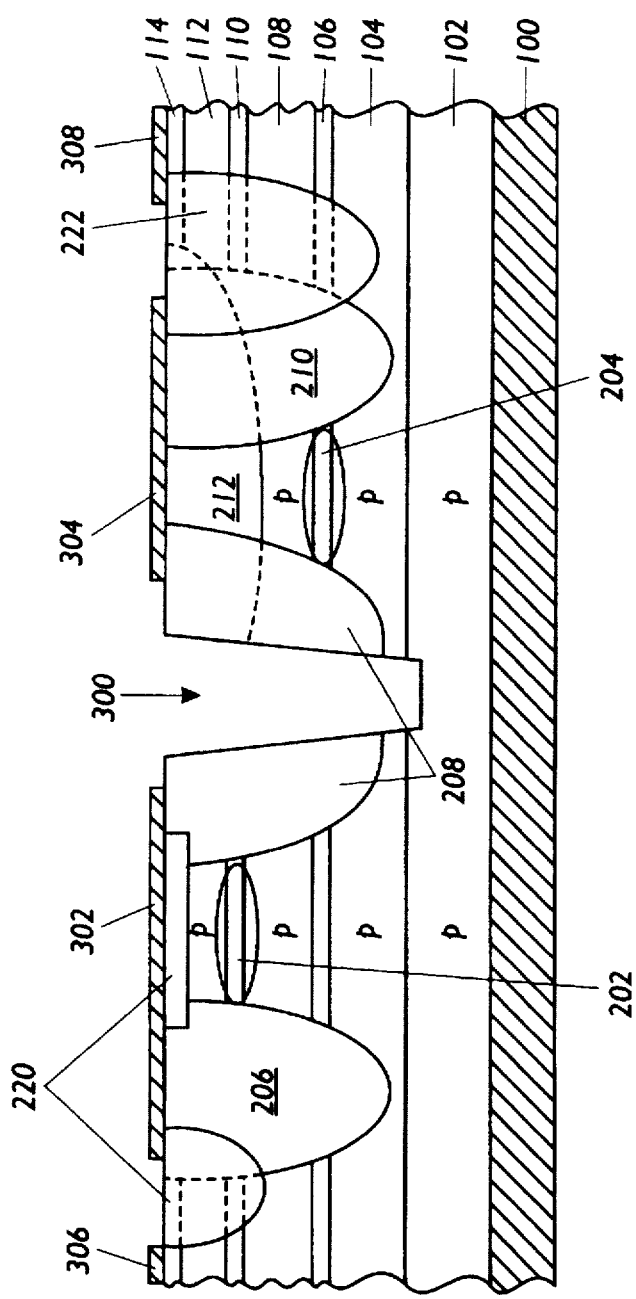
FIG. 3 illustrates a cross-sectional view of a dual laser array with lateral waveguides of each individual lasing element formed by a two-step impurity induced layer disordering process.

After the lasing elements 202 and 204 have been formed, regions must be formed to isolate the individual lasing elements from each other. FIG. 3 illustrates the use of a groove 300 to isolate the lower lasing element 204 and upper lasing element 202. The groove 300 is formed by chemical etching and reaches through the respective active layer of the upper and lower lasing elements 202 and 204. Reactive ion etching, ion milling, or other means known to those of ordinary skill in the art may also be used to form the channels.

FIG. 3 also illustrates the formation of contacts to lasing elements 202 and 204. An n-type contact 302 to the upper lasing element 202 is formed above the regions 206 and 208, which have been disordered by silicon atoms. Electrons are laterally or transversely injected into the active layer of upper lasing element 202 from the regions 206 and 208. A surface p-type contact 306 is used under this approach since all of the semiconductor layers are p-type.

Likewise, an n-type contact 304 to the lower lasing element 204 is formed above the disordered region 212. Electrons are laterally or transversely injected into the active layer of lower lasing element 204 from the regions 208 and 210, which have been disordered by silicon atoms. The p-type contact to the lower lasing element 204 is made with a surface contact 308. Since all of the deposited semiconductor layers are p-type, this approach is equally applicable to using an n-type substrate as a starting material.

Figure 4:
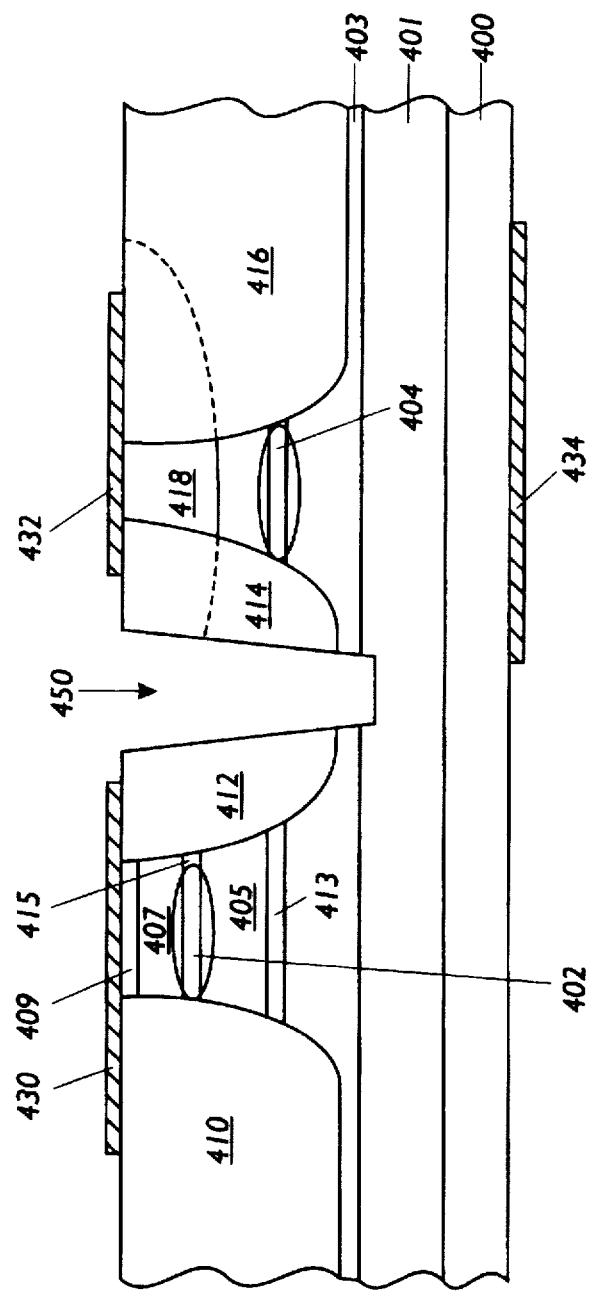
FIG. 4 shows a cross-sectional view of an alternative embodiment of the present invention which includes a dual-beam laser array formed on a p-type substrate.

FIG. 4 shows an alternative embodiment which uses p-type GaAs substrate 400. Under this alternative embodiment, the processing sequence is similar to using an n-type or semi-insulating substrate. The structure that forms a laser array can be identical to FIG. 1. However, the top GaAs layer 409 can instead be n-type as shown in FIG. 4. After all the semiconductor layers have been grown, a 2-step IILD process is again used to form the lateral waveguides of the upper lasing element 402 and lower lasing element 404. A deep IILD step forms the disordered regions 410, 412, 414, and 416, that reach the lower cladding layer 403 of the lower lasing element 404. A shallow IILD step, which forms the disordered region 418, short circuits the active layer 415 of the upper lasing element 402 so that only the active layer 413 of the lower lasing element 404 would achieve lasing condition. Then, a groove 450 is etched to isolate the individual lasing elements 402 and 404. Since the p-contact 434 is formed on the backside of the p-type GaAs substrate 400, there is no need to use proton implantation to isolate the p-type and n-type contacts. N-type contact 430 to the upper lasing element 402 is formed above the n-contact layer 409 whereas the n-type contact 432 to the lower lasing element 404 is formed above the disordered region 418. These n-type contacts 430 and 432, along with the p-contact 434, allow biasing to each of the lasing elements 402 and 404.

The composition, dopants, doping levels and dimensions given above are exemplary only and variations in these parameters are permissible. Additionally, other layers in addition to the ones shown in the Figures may also be included. Lastly, instead of GaAs and GaAlAs, other light emitting semiconductor materials, such as GaAlSb, InP, InGaAsP, other III–V alloys, II–VI alloys, and IV–VI alloys, may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. An independently-addressable semiconductor laser array, comprising:

(a) a substrate;

(b) a plurality of semiconductor layers on said substrate which further comprises of a first active layer of a first lasing element and a second active layer of a second lasing element, wherein said first and second lasing elements are laterally separated and wherein said first lasing element is closer to said substrate than said second lasing element;

(c) layer disordered waveguiding regions laterally located on either side of said first and second lasing elements;

(d) a layer disordered region on the side of said first lasing element remote from said substrate, which replaces a portion of said second active layer adjacent said first lasing element;

(e) an isolation region formed between said first and second lasing elements to electrically isolate said first and second lasing elements; and (f) an electrode connected to each of said first and second lasing elements for causing each of said lasing elements to independently emit radiation.

2. The independently-addressable semiconductor laser array of claim 1 wherein said layer disordered waveguiding regions and said layer disordered region extend into said semiconductor layers from the surface of said plurality of semiconductor layers.

3. The independently-addressable semiconductor laser array of claim 1 wherein said first lasing element is formed to emit radiation at a first wavelength and said second lasing element is formed to emit radiation at a second wavelength.

4. The independently-addressable semiconductor laser array of claim 1 wherein said first lasing element is formed to emit radiation at a first polarization and said second lasing element is formed to emit radiation at a second polarization orthogonal to said first polarization.

5. The independently-addressable semiconductor laser array of claim 1 wherein said first and second lasing elements are transversely injected laser structures.

6. The independently-addressable semiconductor laser array of claim 1 wherein said substrate is GaAs.

7. The independently-addressable semiconductor laser array of claim 1 wherein said substrate is p-type.

8. The independently-addressable semiconductor laser array of claim 1 wherein said substrate is n-type.

9. The independently-addressable semiconductor laser array of claim 1 wherein said substrate is semi-insulating.

10. The independently-addressable semiconductor laser array of claim 1 wherein said array is integrated with embedded circuitry on said substrate.

11. The independently-addressable semiconductor laser array of claim 1 wherein said array is an element of an electronic device.

* * * * *